(12) United States Patent
Hartz et al.

(10) Patent No.: US 11,994,942 B2
(45) Date of Patent: May 28, 2024

(54) RAW BIT ERROR RATE BASED TRIM LEVEL ADJUSTMENTS FOR MEMORY

(71) Applicant: Micron Technology, Inc., Boise, ID (US)

(72) Inventors: Ezra E. Hartz, Boise, ID (US); Joseph A. De La Cerda, Boise, ID (US); Nicolas Soberanes, Boise, ID (US); Christopher Moore, Redwood City, CA (US); Bruce J. Ford, Meridian, ID (US); Benjamin Rivera, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 123 days.

(21) Appl. No.: 17/558,035

(22) Filed: Dec. 21, 2021

(65) Prior Publication Data

US 2023/0195559 A1    Jun. 22, 2023

(51) Int. Cl.
*G06F 11/00*    (2006.01)
*G06F 11/07*    (2006.01)

(52) U.S. Cl.
CPC ...... *G06F 11/0793* (2013.01); *G06F 11/0727* (2013.01); *G06F 11/076* (2013.01)

(58) Field of Classification Search
CPC ............ G06F 11/0793; G06F 11/0727; G06F 11/076; G06F 11/0754
See application file for complete search history.

(56) References Cited

U.S. PATENT DOCUMENTS

| | | | |
|---|---|---|---|
| 7,359,255 B2 | 4/2008 | Kimura | |
| 9,176,810 B2 | 11/2015 | Peterson | |
| 10,102,896 B2 | 10/2018 | Jam | |
| 11,106,532 B1* | 8/2021 | Singidi | ............... G06F 11/3037 |
| 2009/0033306 A1 | 2/2009 | Tanzawa | |
| 2015/0092488 A1* | 4/2015 | Wakchaure | ............ G11C 16/26 365/185.18 |
| 2016/0117216 A1* | 4/2016 | Muchherla | ............... G06F 11/30 714/6.11 |
| 2019/0065331 A1* | 2/2019 | Singidi | ................ G11C 29/883 |
| 2021/0193229 A1 | 6/2021 | Liikanen | |

\* cited by examiner

*Primary Examiner* — Katherine Lin
(74) *Attorney, Agent, or Firm* — Brooks, Cameron & Huebsch, PLLC

(57) ABSTRACT

A processing device coupled to the memory device can be configured to monitor respective raw bit error rates (RBERs) corresponding to a plurality of groups of memory cells of the memory device. The processing device can also be configured to responsive to determining that an RBER corresponding to a particular group of the plurality of groups of memory cells has met a criteria, adjust a read window budget corresponding to the particular group of memory cells.

18 Claims, 7 Drawing Sheets

RAW BIT ERROR RATE BASED TRIM LEVEL ADJUSTMENTS FOR MEMORY

TECHNICAL FIELD

Embodiments of the disclosure relate generally to memory sub-systems, and more specifically, relate to adjusting trim levels in memory based on raw bit error rates (RBER).

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
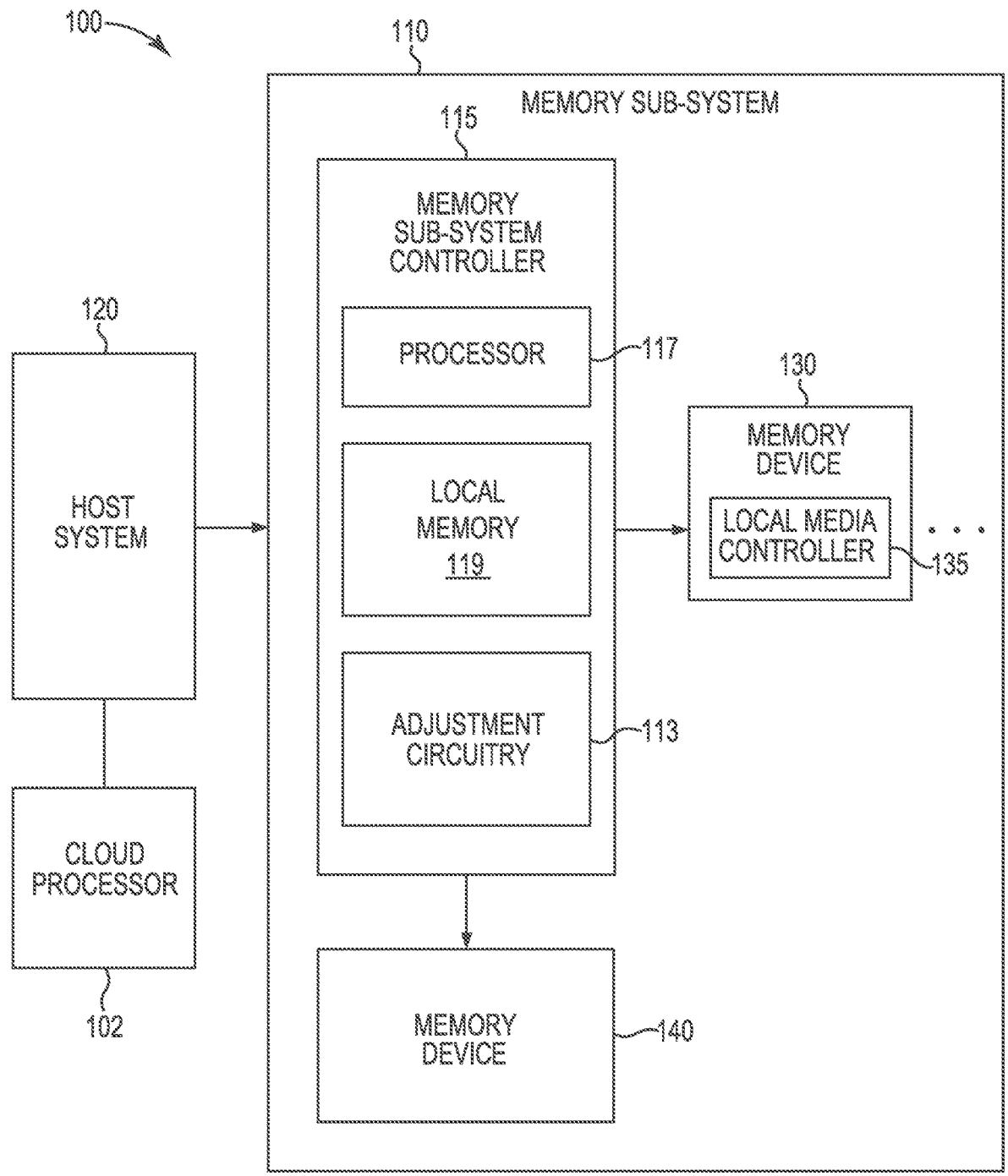
FIG. 1 illustrates an example computing system that includes a memory sub-system in accordance with some embodiments of the present disclosure.

Aspects of the present disclosure are directed to adjusting trim levels in memory based on raw bit error rates (RBER), in particular to memory sub-systems that include adjustment circuitry to adjust trim levels. A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of non-volatile memory devices is a negative-and (NAND) memory device (also known as flash technology). Other examples of non-volatile memory devices are described below in conjunction with FIG. 1. A non-volatile memory device is a package of one or more dice. Each die can consist of one or more planes. Planes can be groups into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. A block hereinafter refers to a unit of the memory device used to store data and can include a group of memory cells, a word line group, a word line, or individual memory cells. For some memory devices, blocks (also hereinafter referred to as "memory blocks") are the smallest area than can be erased. Pages cannot be erased individually, and only whole blocks can be erased.

Each of the memory devices can include one or more arrays of memory cells. Depending on the cell type, a cell can store one or more bits of binary information, and has various logic states that correlate to the number of bits being stored. The logic states can be represented by binary values, such as "0" and "1", or combinations of such values. There are various types of cells, such as single level cells (SLCs), multi-level cells (MLCs), triple level cells (TLCs), and quad-level cells (QLCs). For example, a SLC can store one bit of information and has two logic states.

Some NAND memory devices employ a floating-gate architecture in which memory accesses are controlled based on a relative voltage change between the bit line and the word lines. Other examples of NAND memory devices can employ a replacement-gate architecture that can include the use of word line layouts that can allow for charges corresponding to data values to be trapped within memory cells based on properties of the materials used to construct the word lines.

Storage solutions may compensate for raw bit error rate (RBER) increases by using redundant array of independent NAND (RAIN). Memory may provide an error correction section for every page. However, as RBERs increase beyond correctability using RAIN, the RAIN system can create additional levels of correction by adding a parity bit in addition to the error correction section such that if a certain page fails, the page can be recovered using the parity bit and not the error correction section. However, RBER increases can exceed the ability to correct errors using the above techniques while maintaining a low overhead to implement the corrective measures. As used herein, RAIN describes advanced error checking and correcting utilizing redundant arrays of independent NAND. RAIN allows data that includes errors to be decoded. RBER is a bit error rate experienced by memory before the errors are corrected using, for example, error correction code (ECC) operations. RBERs can reflect the reliability of memory. For example, an increase of a RBER of memory can indicate that the reliability of the memory is decreasing.

Aspects of the present disclosure address the above and other deficiencies by adjusting trim levels used to operate (e.g., program) memory devices based on a RBER of the memory. For example, as portions of memory (e.g., blocks, pages, etc.) experience increased RBER, the trim levels can be adjusted in order to increase a read window budget (RWB) and thereby decreasing the RBER. Utilizing trim levels to lower the RBER can overcome the limits of ECC and RAIN data protection schemes that may be used to detect and/or correct data errors. Additionally, trim levels can be adjusted based on blocks or pages (e.g., memory cells coupled to a word line) if trends show that an increase in RBER is limited to these areas of the die such that a page-to-page and block-to-block RBER is more consistent. The examples described herein provide additional flexibility, over RAIN and ECC corrections, in tuning the performance of RAIN by allowing for additional variables to compensate for RBER.

Additionally, RBER data can be gathered for a plurality of memory sub-system and utilize to predict failures of blocks and/or pages of the plurality of memory sub-system. As used herein, trim levels can include pulse magnitude, step size, pulse duration, program verify voltages, and/or read voltages, among other possible trim levels. A read window budget (RWB) can refer to the cumulative value (e.g., in voltage) of a number of distances (e.g., in voltage) between adjacent threshold voltage distributions at a particular bit error rate (BER). The RBW can also refer to the voltage margin between adjacent states/distributions. Such characteristics include pulse magnitude, step size between pluses, pulse duration, program verified voltages, and/or read voltages, among other possible trim levels. Adjusting trim levels can result in an adjustment to the RWB.

As used herein, a program step size can be referred to as a voltage difference between successive voltage pulses, and a program step duration can be referred to as a duration for which a voltage pulse is applied. In relation to program step duration, in at least one example, program step duration can be measured by counting clock cycles of a known frequency between a time a program command was issued to a memory (e.g., NAND) and when the memory programming operation is complete. In another example, the program step duration can be measured by using a number of program pulses used to complete the memory program operation and apply a known amount of time for each pulse.

A read window, which may be referred to as a read window width, refers to a distance (e.g., in voltage) between adjacent threshold voltage (Vt) distributions at a particular bit error rate. A read window may also be referred to as a "valley margin" since the Vt distributions include respective peaks with the regions therebetween being referred to as valleys. The RWB can refer to a cumulative value of read windows for a group of programmed cells (e.g., one or more pages of cells). For example, cells configured to store three bits of data per cell may be programmed to one of eight different Vt distributions, each corresponding to a respective data state. The RWB can be the cumulative value (e.g., in voltage) of the seven read windows between the eight Vt distributions. The RWB corresponding to a group of memory cells is affected by various factors such as temperature, wear cycling (e.g., program/erase cycles), etc. Therefore, the RWB(s) of a system can vary over time, which can affect system quality of service (QoS), reliability, and/or performance. In various instances, it can be beneficial to maintain a specified RWB in order to maintain a particular system characteristic QoS, error rate, etc.) across various environmental conditions and/or user workloads. However, it can also be beneficial to provide the ability to dynamically adjust a RWB (e.g., to a target value) in order to change one or more system characteristics. For instance, it may be beneficial to provide one system, or components thereof, with a relatively high RWB associated with high reliability (e.g., low bit error rate) and another system, or components thereof, with a relatively low RWB associated with higher speed. It can also be beneficial to adjust the RWB of a particular system or component thereof such that the system operates at different reliability levels and speed at different times.

In various examples, the RBERs can be utilized to determine whether to retire a group of memory cells of a memory device. For example, the RBERs corresponding to a plurality of groups of memory cells can be provided to a host coupled to the memory sub-system. The host can provide the RBERs to a network processing device. The network processing device can be part of a cloud system. The network processing device can be utilized to identify groups of the plurality of groups of memory cells that are likely to fail. The network processing device can notify the memory sub-system, through the host, of groups of memory cells that are likely to fail. The memory sub-system can refrain from utilizing the groups of memory cells that are likely to fail. In various instances, the memory sub-system can identify the groups of memory cells that are likely to fail based on the RBERs corresponding to a plurality of groups of memory cells. The network processing device may be better apt at identifying the groups of memory cells that are likely to fail given that the networking processing device can receive RBERs from multiple memory sub-system such that the networking processing device can better identify trends that point to a group of memory cells as being likely to fail.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include a adjustment circuitry 113. Although not shown in FIG. 1 so as to not obfuscate the drawings, the adjustment circuitry 113 can include various circuitry to facilitate modifying a trim level based on a RBER of a memory device 130, a block of the memory device 130, and/or memory cells coupled to word line of the memory device. In some embodiments, the adjustment circuitry 113 can include special purpose circuitry in the form of an ASIC, FPGA, state machine, and/or other logic circuitry that can allow the adjustment circuitry 113 to orchestrate and/or perform operations as described herein.

In some embodiments, the memory sub-system controller 115 includes at least a portion of the adjustment circuitry 113. The memory sub-system controller 115 can include a processor 117 (processing device) configured to execute instructions stored in local memory 119 for performing the operations described herein. In some embodiments, the adjustment circuitry 113 is part of the host system 110, an application, or an operating system.

In a non-limiting example, an apparatus (e.g., the computing system 100) can include the adjustment circuitry 113. The adjustment circuitry 113 can be resident on the memory sub-system 110. As used herein, the term "resident on" refers to something that is physically located on a particular component. For example, the adjustment circuitry 113 being "resident on" the memory sub-system 110 refers to a condition in which the hardware circuitry that comprises the adjustment circuitry 113 is physically located on the memory sub-system 110. The term "resident on" can be used interchangeably with other terms such as "deployed on" or "located on," herein.

The adjustment circuitry 113 can be configured to adjust trim levels of the memory devices 130, 140 based on RBER values. In various examples, an artificial (AI) system can allow trim levels to be adjusted as an RBER increases to keep the memory devices 130, 140 (e.g., memory cells of blocks and/or word lines) from failing. Adjusting the trim levels can negatively impact performance of the memory devices 130, 140 while maintaining operating margins from failing RBER levels. Adjusting the trim levels can include modifying the program trims to increase the read window budget (RWB) (e.g., voltage separation between logic levels on NAND flash memory). The adjustment circuitry 113 and/or the processor 117 can determine whether the RBER increase experienced in one word line (WL) in many blocks, in certain block ranges, or overall impacting most blocks and WLs. Based on the determination, the trim levels corresponding to the one WL in many blocks, to certain block ranges, or most blocks and WLs, can be updated.

In various instances, the adjustment circuitry 113 can provide the RBERs and corresponding blocks and/or word lines to the host system 120. The host system 120 can provide said RBERs and the corresponding blocks and/or word lines to a cloud processor 102. A cloud processor 102 can represent a processor coupled to the host 120 via a network such as network 520 in FIG. 5. The cloud processor 102 can be incorporated in a host, for example. The cloud processor 102 can also be referred to as a network host. The cloud processor 102 can perform AI to identify blocks that are likely to fail using the RBERs and the corresponding blocks and/or word lines provided by the host system 120.

As used herein, AI refers to the ability to improve a machine through "learning" such as by storing patterns and/or examples which can be utilized to take actions at a later time. The patterns and/or examples stored and utilized by the cloud processor 102 include the RBERs and the corresponding blocks and/or word lines. References to blocks and/or word lines can include references to identifiers of blocks and/or word lines. Machine learning refers to a device's ability to learn from data provided as examples. Machine learning can be a subset of AI. As used herein, an artificial neural network (ANN) can provide learning by forming probability weight associations between an input and an output. The probability weight associations can be provided by a plurality of nodes that comprise the ANN. The nodes together with weights, biases, and activation functions can be used to generate an output of the ANN based on the input to the ANN. An ANN can utilize a number of inputs to generate an identifier of blocks and/or word lines that are forecasted to fail. In various instances, AI can be implemented by an accelerator such as a deep learning accelerator. A deep learning accelerator can comprise hardware configured to perform AI operations. For instance, a deep learning accelerator can host an ANN.

The cloud processor 102 can receive the RBERs and the corresponding blocks and/or word lines from a plurality of sub-systems via a plurality of different hosts including the host 120. The cloud processor 102 can track trends in the RBERs of the plurality of memory sub-systems. The cloud processor 102 can utilize a knowledge of a common architecture of the plurality of memory sub-systems and the RBER to make predictions of blocks and/or word lines that are likely to fail. For instance, the cloud processor 102 can determine that a particular block from a memory sub-system failed based on a corresponding RBER value. The cloud processor 102 can determine that corresponding blocks for different memory sub-systems are likely to fail based on a knowledge of the failure of the particular block and based on the RBER value(s) corresponding to the corresponding block. The corresponding block can correspond to the particular block given that the corresponding block and the particular block are similarly placed in an architecture of the corresponding memory sub-systems. For example, a first block can correspond to a second block if both of the first block and the second block are edge blocks of memory devices of memory sub-systems.

The cloud processor 102 can provide the predictions, of blocks and/or word lines that are expected to fail, to the host system 120. The host system 120 can provide the predictions to the adjustment circuitry 113. The adjustment circuitry 113 can utilize the predictions to adjust the RWB of corresponding blocks (e.g., blocks identified by the predictions).

In various instances, the cloud processor 102 can perform the actions described herein utilizing AI such as a ANN. For instance, the cloud processor 102 can itself be a deep learning accelerator or can utilize a deep learning accelerator to perform at least a portion of the actions described herein.

Figure 2:
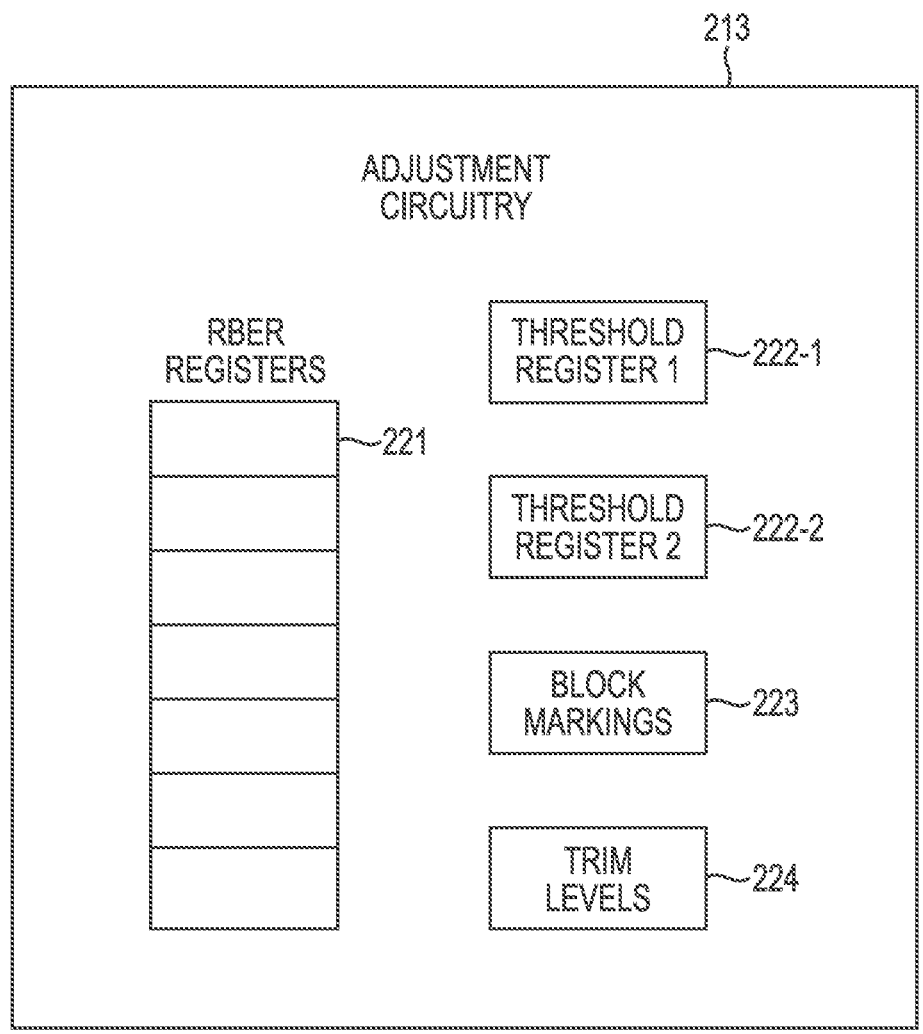
FIG. 2 illustrates a block diagram of example adjustment circuitry in accordance with some embodiments of the present disclosure.

FIG. 2 illustrates a block diagram of example adjustment circuitry 213 in accordance with some embodiments of the present disclosure. The adjustment circuitry 213 can include RBER registers 221, threshold registers 222-1, 222-2, blocked registers 223, and trim level registers 224. The threshold registers 222-1, 222-2 can be referred to as thresholds 222.

The adjustment circuitry 213 can track the RBERs corresponding to respective blocks. The adjustment circuitry 213 can store the RBERs and/or the respective blocks and/or word lines in the RBER registers 221. The adjustment circuitry 213 can utilize thresholds stored in the thresholds registers 222-1 and the RBERs to determine whether to continue to utilize respective blocks and/or memory cells coupled to respective word lines. The adjustment circuitry 213 can utilize thresholds stored in the threshold registers 222-2 and the RBERs to determine whether to adjust trim levels for respective blocks and/or memory cells coupled to respective word lines.

The adjustment circuitry 213 can store identifiers of the blocks and/or memory cells coupled to respective word lines that are retired and/or marked as bad in the blocked registers 223. The adjustment circuitry 213 can store trim levels in the trim level registers 224. For example, the adjustment circuitry 213 can modify the trim levels of the memory devices by modifying the values stored in the trim level registers 224. For instance, the adjustment circuitry 213 can modify RWB values by modifying the trim levels stored in the trim level registers 224 based on the RBER values stored in the RBER registers 221 and/or the thresholds stored in the threshold registers 222. The adjustment circuitry 213 can also modify RWB values based on the RBERs values stored in the RBER registers 221, the threshold stored in the registers 222, and/or the predictions provided by the network processor as defined in FIGS. 3A, 3B, 3C.

Figure 3A:
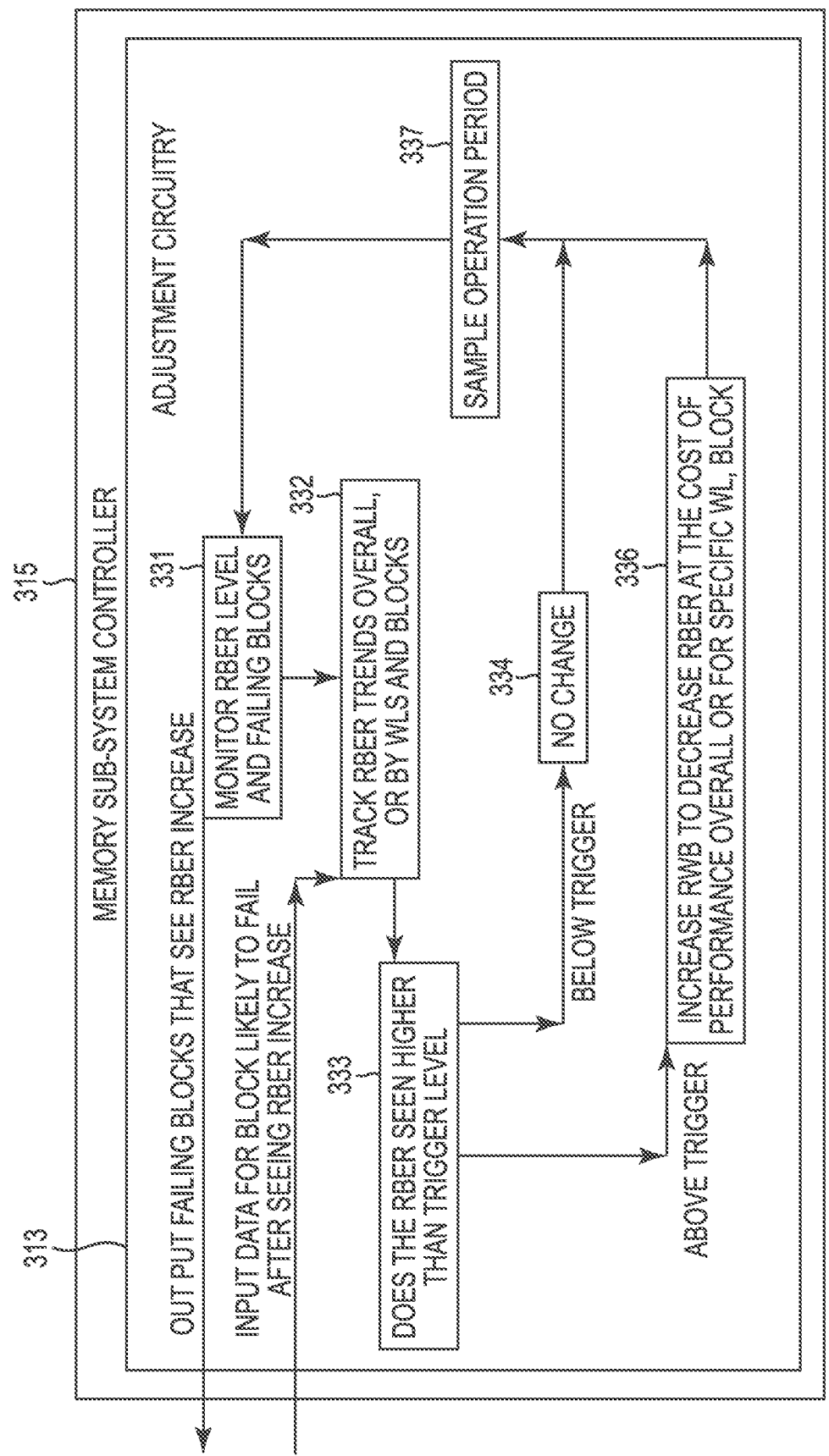
FIG. 3A is a flow diagram corresponding to adjustment circuitry in accordance with some embodiments of the present disclosure.
Figure 3B:
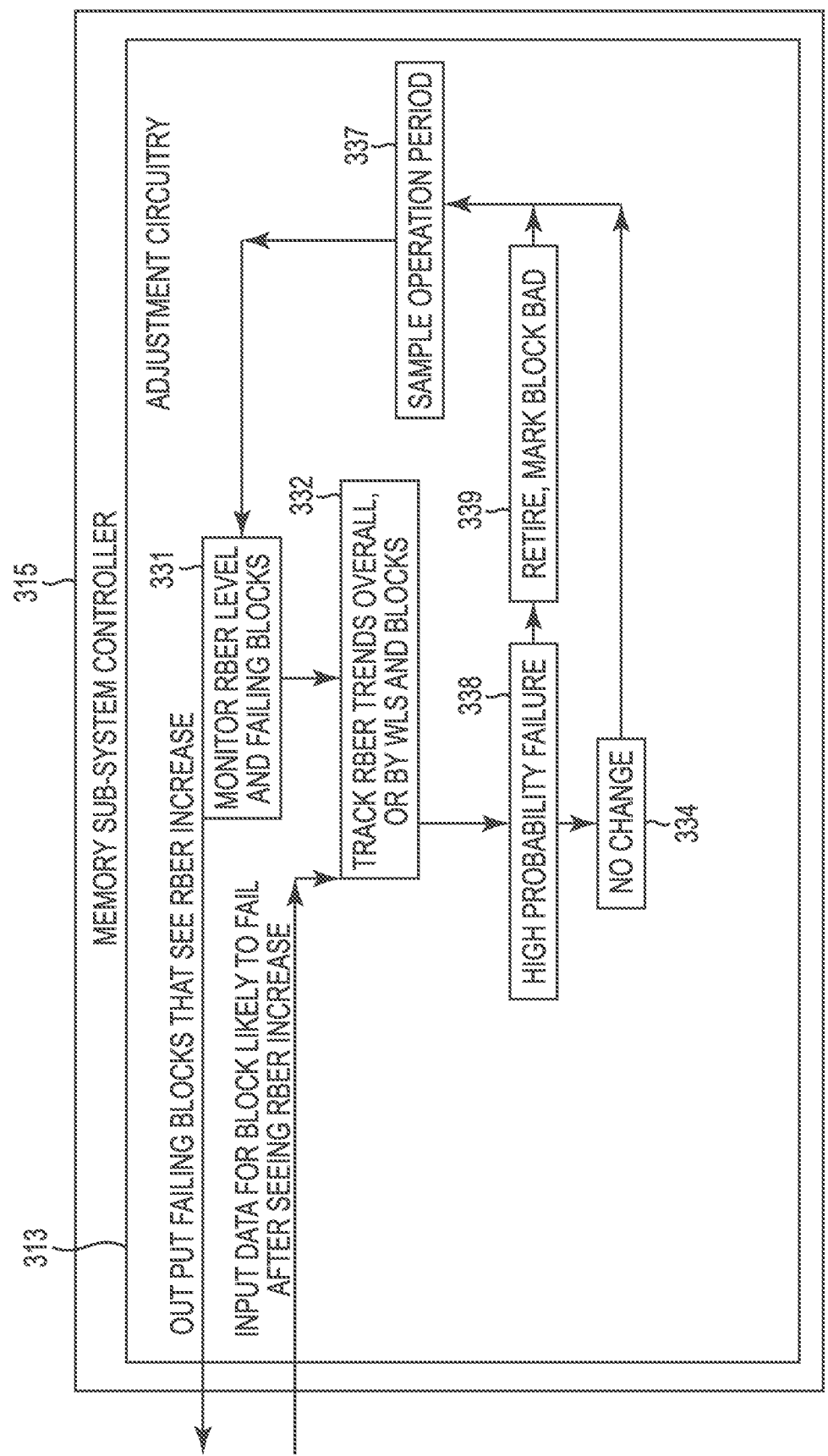
FIG. 3B is a flow diagram corresponding to adjustment circuitry in accordance with some embodiments of the present disclosure.
Figure 3C:
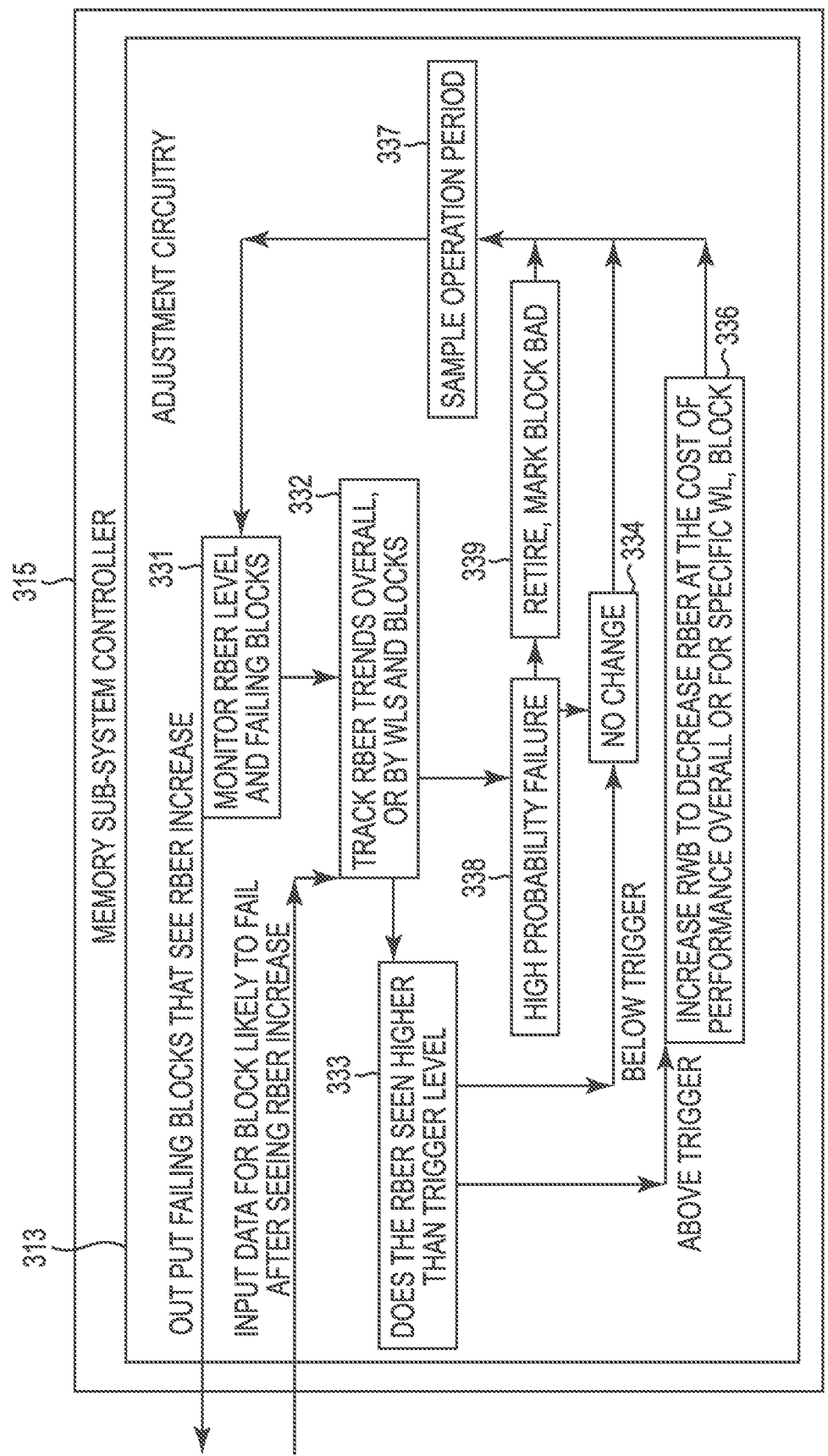
FIG. 3C is a flow diagram corresponding to adjustment circuitry in accordance with some embodiments of the present disclosure.

FIGS. 3A, 3B, 3C are a flow diagrams corresponding to adjustment circuitry 313 in accordance with some embodiments of the present disclosure. FIGS. 3A, 3B are different flow diagrams that share similarities. FIG. 3C combines the flow diagrams shown in FIGS. 3A, 3B. FIGS. 3A, 3B, 3C show a memory sub-system controller 315 as comprising the adjustment circuitry 313. The adjustment circuitry 313 is shown as performing the flow diagram shown.

FIG. 3A shows a flow diagram for determining whether to adjust trim levels (e.g., trim levels stored in trim level registers 224 of FIG. 2) of memory devices. At operation 331, the adjustment circuitry 331 can monitor RBER levels and failing blocks/word lines. As used herein, references to blocks and/or word lines can include references to memory cells of the blocks and/or memory cells coupled to the word lines. To monitor the RBER levels, the adjustment circuitry 331 can access the RBER values from the RBER registers 221 of FIG. 2. The adjustment circuitry 331 can access the RBER levels by sampling the RBER values, generating the RBER values, and/or reading the RBER values.

The RBERs can be accessed for all blocks and/or memory cells coupled to word lines in the memory devices of the memory sub-system. The RBERs can also be accessed for blocks that are identified as failing and/or memory cells coupled to word lines that are identified as failing. For example, the adjustment circuitry 313 can monitor all RBERs of the memory devices to determine which of the RBERs experience increases. The RBERs that increase can be stored in RBER registers. The RBERs that increase and their corresponding blocks/word lines can be provided as an output to a host.

At operation 332, the adjustment circuitry 313 can track RBER trends. For example, the adjustment circuitry 313 can track RBERs to determine whether there are any trends. Determining whether there are any trends can include determining whether there are any patterns. For example, a trend can describe an increase of the RBERs of a block of memory over multiple consecutive sampling periods. The adjustment circuitry 313 can determine whether there are any trends at the word line level, at the block level, and/or at the memory device level.

At operation 333, the adjustment circuitry 313 can track the trends of the RBERs by determining whether any of the RBERs are greater than a threshold (e.g., trigger level). At operation 334, responsive to determining, for each of the RBERs, that the RBERs are not greater than a threshold, no changes can be made to a corresponding block and/or word line. For instance, if a first RBER is less than a threshold, then not changes are made to a first block and/or word line corresponding to the RBER.

At operation 334, responsive to determining, for each of the RBERs, that at least one of the RBERs are greater than the threshold, the adjustment circuitry can modify the trim levels corresponding to the block(s) and/or word line(s) associated with the at least one of the RBERs. For instances if a second RBER is greater than the threshold, then a trim level corresponding to a second block and/or word line can be modified, where the second RBER is an RBER for the second block and/or word line.

The trim levels can be modified to obtain a modified RWB. For instance, the RWB can be increased by adjusting the trim levels appropriately (e.g., by adjusting various programming parameters such as programming voltage magnitudes, step sizes, step durations, quantity of pulses, etc.). Increasing the RWB can cause the RBER to decrease at the cost of performance of the memory device, the corresponding word line, and/or the corresponding block. The RWB can be increased for an entire memory device, for a corresponding word line, and/or a corresponding block.

At operation 332, the RBERs can be accessed for word lines, blocks, and/or for a memory device. In various instances, the adjustment circuitry 313 can determine a granularity of RBERs based on an input received from the host and the input received from operation 331. A granularity of RBERs can describe whether the RBER is calculated for a memory device, for a block, and/or for a word line. For instance, if the host identifies a particular block as likely to fail, then the operation 332 can generate an RBER for said block. At operation 333, a determination can be made as to whether the RBER is greater than a threshold. Responsive to being greater than the threshold, the RWB of the particular block having the RBER can be increased.

At operation 337, a sample period can elapse, returning to operation 331. The RBER trends can be tracked by retaining RBER values for multiple sample periods. In various instances, each RBER may not be compared to the threshold. RBERs that are identified as likely to fail can be compared to the thresholds.

FIG. 3B shows operations 331, 332, 337 as previously described. At operation 338, a determination can be made as to whether a block has a high probability of failure. The RBERs, the corresponding the WLs and/or blocks, and/or the input from the host can be utilized to identify blocks with a high probability of failure. For instances, if the input provided by the host identifies a block as being likely to fail and/or if the RBER corresponding to the block is above a second threshold, then the operation 338 can identify the block as having a high probability of failure.

At operation 339, responsive to identifying a block as likely to fail, the block can be marked such that the memory sub-system refrains from utilizing the block. The adjustment circuitry 313 can mark the block utilizing the block registers 223 of FIG. 2. Marked blocks can be retired or the memory sub-system can refrain from utilizing the marked block. A retired block is a block is not usable. The effects of retiring a block are not reversable. Refraining from utilizing the marked block implies that the effects of marking a block are reversable such that a marked block can be used at a future time.

At operation 334, if no block is identified as being likely to fail, then no changes can be implemented. At operations 337, a sample operation period can lapse. The sample operation period describes a duration of time after which new RBERs can be collected. After the sample operation period lapses, operation 331 can be performed.

FIG. 3C combines the elements of FIG. 3A and FIG. 3B. Two or more thresholds can be utilized to determine whether to retire/mark a block as bad and/or update trim levels. A first threshold can be utilized to determine whether to retire and/or mark a block as bad. For example, each of the RBERs can be compared to the first threshold. Blocks with RBERs that are greater than the first threshold can be retired and/or marked as bad. In various examples, blocks that are marked as likely to fail by the input provided by the host and that have RBERs that are greater than the first threshold can be retired/marked as bad at operation 339.

A second threshold can be utilized to determine whether to adjust the trim levels. For example, at operation 333, a second threshold can be utilized along with the input provided by the host to determine whether to increase a RWB of particular blocks and/or memory cells coupled to word lines. For instance, at operation 333, the RBERs can be compared to the second threshold. Blocks and/or word lines that have RBERs that are greater than the second threshold and that are identified as likely to fail by the input of the host can have corresponding RWBs increased to decrease the RBERs. In various instances, the first level can be greater than the second level. The first level can also be equal to the second level.

In various instances at operation 333, a determination can be made as to whether to increase the RWB for a memory device as a whole. For instance, if a majority of the RBERs of a memory device are greater than the second threshold, then, at operation 333, the RWBs for the memory device as a whole can be increased as opposed to increasing the RWBs of specific blocks and/or memory cells coupled to a specific word line.

At operation 331, the output provided to a host can include identifiers of blocks and/or word lines. For instance, the output can include identifiers of memory cells in a block of a memory device and/or memory cells coupled to a word line of the memory device. The identifiers can include memory addresses of memory cells. In various instances, the identifiers can be of blocks and/or word lines as appose to the addresses of memory cells.

Figure 4:
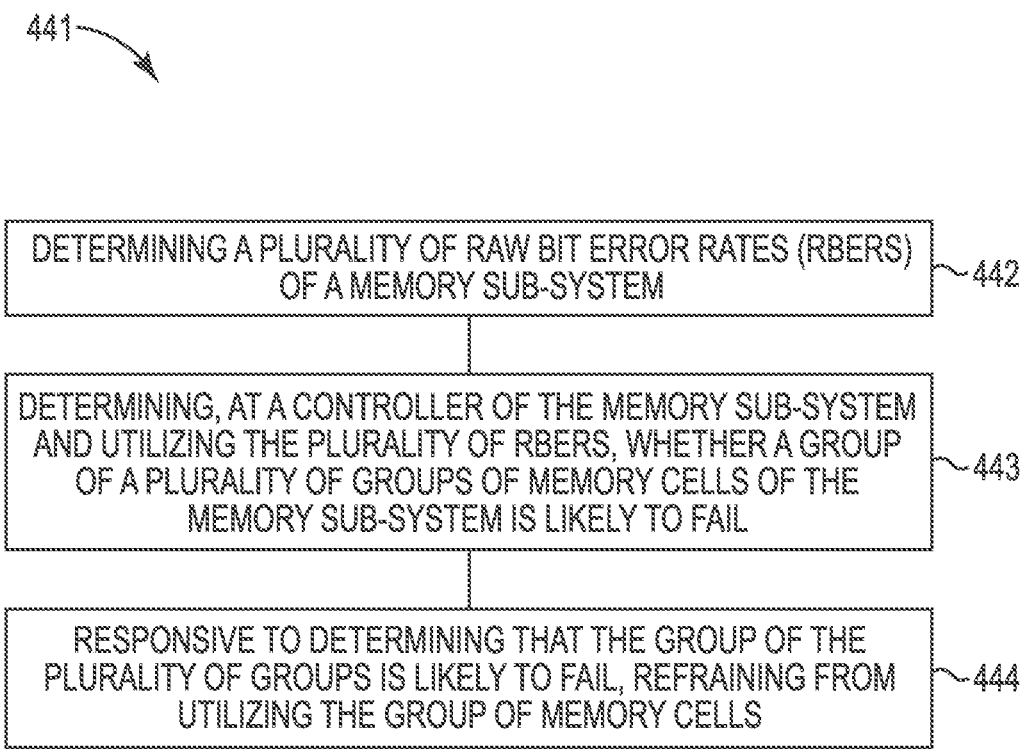
FIG. 4 is a flow diagram corresponding to a method for trim level adjustments in memory based on raw bit error rates in accordance with some embodiments of the present disclosure.

FIG. 4 is flow diagram corresponding to a method 441 for adjusting trim levels in memory based on raw bit error rates (RBER) in accordance with some embodiments of the present disclosure. The method 441 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 441 is performed by the adjustment circuitry 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 442, a plurality of raw bit error rates (RBERs) of a memory sub-system can be determined. Each of the RBERs can correspond to a different group of memory cells. Each of the groups of memory cells can correspond to memory cells coupled to a word line or a block of memory cells, for example. The RBERs can be sampled for a memory device of the sub-system. The RBERs can be sampled for blocks of the memory device. The RBERs can be sampled for memory cells coupled to a word line.

At operation 443, a determination can be made, at a controller of the memory sub-system and utilizing the plurality of RBERs, as to whether a group of a plurality of groups of memory cells of the memory sub-system is likely to fail. At operation 444, responsive to determining that the group of the plurality of groups is likely to fail, the group of memory cells many not be utilized (e.g., refrain from utilizing the group of memory cells). Refraining from utilizing the group of memory cells can include marking the group of memory cells as bad such that the group of memory cells is not usable. Marking the group of memory cells as bad can include identifying the group of memory cells as unusable. The group of memory cells can be identified as unusable (e.g., bad) utilizing a plurality of registers that link the group of memory cells with a statues (e.g., bad).

A controller of the memory sub-system can, prior to executing a command, determine whether a group of memory cells is marked as bad in the plurality of registers. If the group of memory cells is marked as bad in the plurality of registers, the controller can refrain from propagating the command by preventing signals from being provided to decoders of the memory device. In various instances, the controller, prior to executing the command can determine whether a group of memory cells is marked as bad in the plurality of registers. If the group of memory cells is marked as bad, then the controller can limit a use of the group of memory cells. For instance, the controller can limit the group of memory cells to being read and not written to, among other examples of limitations the controller can place on the block of memory cells of a memory device. Refraining from utilizing the group of memory cells can also include retiring the group of memory cells such that the group of memory cells is not available for use. Retiring the group of memory cells can be permanent such that the group of memory cells is permanently not usable. Retiring a group of memory cells can differ from marking a group of memory cells in that a group of memory cells can be marked as good after it has been marked as bad, thus rendering the group of memory cells as usable after it was previously rendered unusable. In various instances, responsive to determining that one of the plurality of groups of memory cells is likely to fail and responsive to determining that the one of the plurality of RBERs is greater than the threshold, the one of the plurality of groups of memory cells corresponding to the one of the plurality of RBERs may not be utilized.

In various instances, the group of memory cells identified as likely to fail can have an identification (ID) that is received from host external to the memory sub-system. For example, a network processor coupled to the host can provide the ID, via the host, to the memory sub-system. The memory sub-system can provide the RBERs to the network processor and/or the host to allow the network processor and/or the host to generate ID utilizing AI, for example.

In various examples, the memory sub-system can determine groups of memory cells that are likely to fail utilizing the RBERs. For example, the RBERs can be compared to a threshold (e.g., an RBER threshold) to determine whether any corresponding one of the groups of memory cells are likely to fail.

Responsive to determining that the one of the plurality of RBERs is smaller than the threshold, the groups of memory cells corresponding to the one of the plurality of RBERs can continue to be utilized. The one of the plurality of groups of memory cells can continue to be utilized by marking the group of memory cells as good such that the group of memory cells is usable. Marking the group of memory cells as good describes identifying the group of memory cells as usable. The group of memory cells can be identifiers as usable utilizing a plurality of registers that link the groups of memory cells with statuses (e.g., good).

In various instances a memory sub-system can comprise a memory device and a processing device (e.g., memory sub-system controller) coupled to the memory device. The processing device can monitor respective RBERs corresponding to a plurality of groups of memory cells of the memory device. The processing device an also, responsive to determining that an RBER corresponding to a particular group of the plurality of groups of memory cells has met a criteria, adjust a read window budget corresponding to the particular group of memory cells.

Monitoring the RBERs can include determining RBERs of a memory sub-system. The RBERs can be sampled prior to correcting errors utilizing an ECC. Sampling RBERs can include determining a quantity of bit errors (e.g., raw bit errors) prior to correcting the bit errors and dividing the quantity of bit errors by a quantity of read bits.

The criteria can be met if any of the plurality of RBERs are greater than a threshold. The threshold can be selected to identify RBERs that are too high which would result in more bit errors being experienced. Responsive to determining that one of the plurality of RBERs is greater than the threshold, the trim levels of the memory sub-system can be adjusted to adjust the read window budget. The RWB adjustment can be applied to each of the plurality of groups of memory cells. For example, if memory cells coupled to a word line have an RBER that is greater than an RBER threshold, then the trim levels for all pages of a block of a memory device can be modified such that the corresponding RBER is increased. Similarly, if a block of memory cells has an RBER that is greater than an RBER threshold, then trim levels for each of the blocks of a memory device can be modified to increase the RBER of the memory device.

Adjusting the trim levels can result in a lower performance of the memory sub-system, memory cells of a block, and/or memory cells coupled to a word line. As such, the trim levels can be adjusted at a cost of performance of the memory sub-system, the memory cells of the block, and/or the memory cells coupled to the word line. In various instances, the RWB can be adjusted for memory cells that are not part of a block and/or are not coupled to a particular word line but that do correspond to the one of the plurality of RBERs. Such can be the case of memory cells that are not part of an array of memory cells but that can be implemented in memory local to the memory sub-system controller and/or memory that comprises a cache system of the memory sub-system, for example.

Responsive to determining that each of the plurality of RBERs is smaller than the threshold, the trim levels of the memory sub-system can be unaffected. That is, the adjustment circuitry can refrain from adjusting the trim levels of the memory sub-system.

In various instances, the RBERs can be monitored for a sampling period. The RBERs can be monitored for each sampling period such that a plurality of RBERs can be generated spanning multiple sampling periods.

The adjustment circuitry of the controller of the memory sub-system can also monitor respective RBERs corresponding to a plurality of groups of memory cells of the memory device. The adjustment circuitry can also, responsive to determining that an RBER corresponding to a particular group of the plurality of groups of memory cells meets a criteria, adjust a read window budget corresponding to the particular group of memory cells. The adjustment circuitry can further, responsive to determining, utilizing the respective RBERs, that a different group of the plurality of groups of memory cells is likely to fail, refrain from utilizing the group of memory cells.

In various instances, the adjustment circuitry can determine that the RBER meets the criteria by determining whether the RBER is greater than a first RBER threshold. The adjustment circuitry can also determine that the different group of memory cells is likely to fail by determining whether the respective RBER is greater than a second RBER threshold where the second RBER is greater than the first RBER.

Responsive to determining that an RBER of the plurality of RBERs is greater than the first threshold, the trim levels of the memory sub-system can be adjusted at a cost of performance of the memory sub-system. Responsive to determining that the RBER of the plurality of RBERs is greater than the second threshold, a group of memory cells corresponding to the RBER of the plurality of RBERs may not be utilized. The controller of the memory sub-system can refrain from utilizing the group of memory cells corresponding to the RBER of the plurality of RBERs.

In various instances, the controller of the memory sub-system can refrain from utilizing the group of memory cells to determining that the RBER of the plurality of RBERs is greater than the second threshold and that the group of memory cells corresponding to the RBER is likely to fail. A determination that the group of memory cells is likely to fail can be received from a host that received the determination from a network processor. That is the determination that the block is likely to fail can be received from a network processor via the host. The network processor can utilize machine learning to generate the determination (e.g., indication) that the block is likely to fail. The memory sub-system can cause the plurality of RBERs and the associated plurality of blocks of memory cells and/or memory cells coupled to a word line to be provided to the network processor via the host to determine whether any of the plurality of blocks and/or the plurality of word lines are likely to fail based on the plurality of RBERs. The network processor can receive the RBERs and the associated plurality of blocks of memory cells and/or memory cells coupled to word lines from a plurality of different memory sub-systems. The network processor can generate prediction based on the examples (e.g., RBERs) received from the memory sub-systems. For instance, the network processor can identify patterns of the RBERs in blocks that failed in a memory sub-system and can use the patterns to predict which blocks in the memory sub-system and/or other memory sub-systems are likely to fail.

Figure 5:
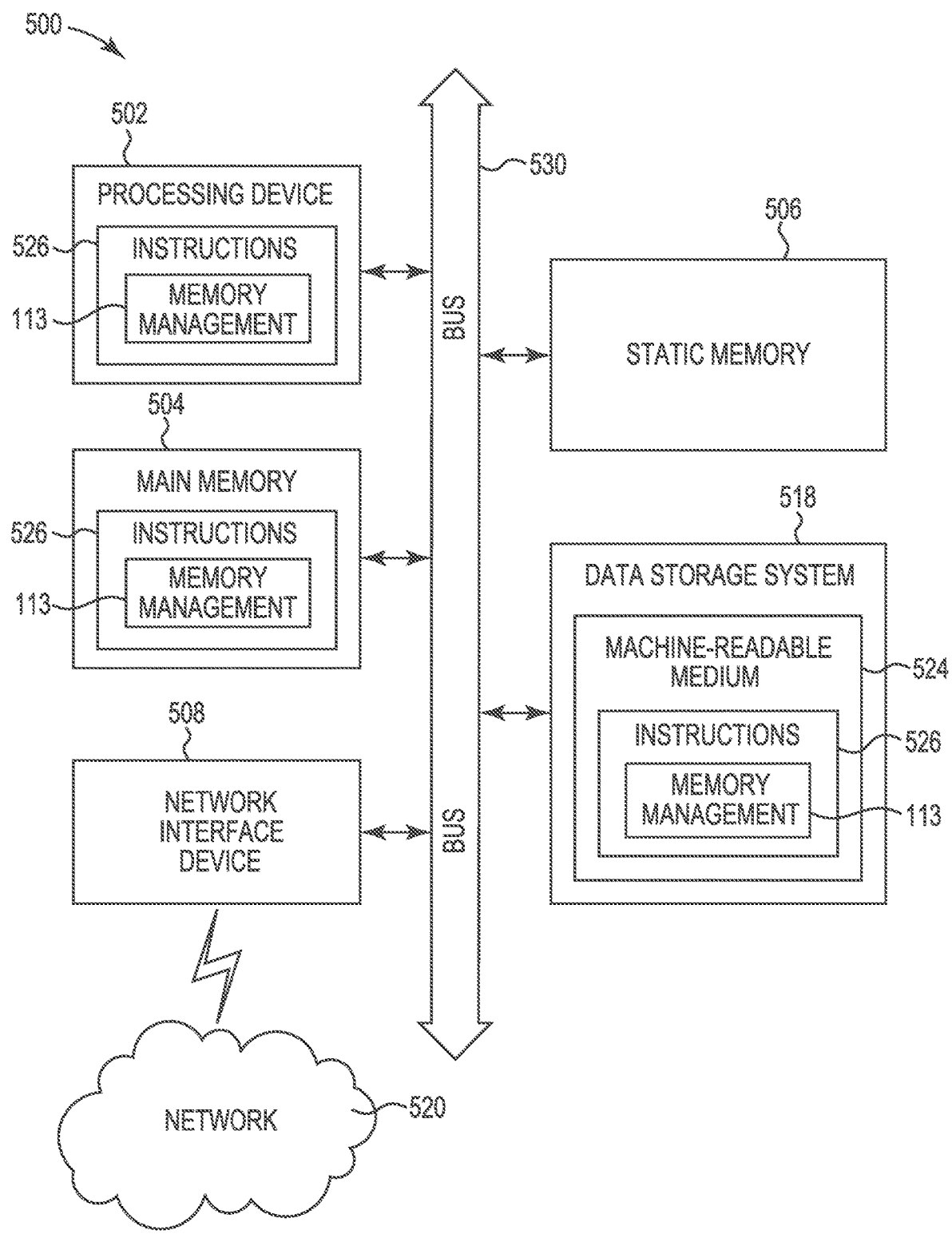
FIG. 5 is a block diagram of an example computer system in which embodiments of the present disclosure may operate.

FIG. 5 is a block diagram of an example computer system 500 in which embodiments of the present disclosure may operate. For example, FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the adjustment circuitry 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

The processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to adjusting trim levels (e.g., the adjustment circuitry 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus, comprising:
a memory device;
a processing device coupled to the memory device and configured to:
monitor respective raw bit error rates (RBERs) corresponding to a plurality of groups of memory cells of the memory device; and
responsive to determining that an RBER corresponding to a particular group of the plurality of groups of memory cells has met a criteria, adjust a read window budget corresponding to the particular group of memory cells.

2. The apparatus of claim 1, wherein the processing device is further configured to determine that the RBER corresponding to the particular group of the plurality of groups of memory cells has met the criteria by determining that the RBER is greater than a threshold.

3. The apparatus of claim 1, wherein the processing device is further configured to monitor the respective RBERs corresponding to the plurality of groups of memory cells, wherein each group of the plurality of groups of memory cells comprises a block of memory cells.

4. The apparatus of claim 1, wherein the processing device is further configured to monitor the respective RBERs corresponding to the plurality of groups of memory cells, wherein each group of the plurality of groups of memory cells comprises memory cells coupled to a respective word line.

5. The apparatus of claim 1, wherein the processing device is further configured to, responsive to determining that the RBER corresponding to the particular group of the plurality of groups of memory cells has met the criteria, adjust the read window budget corresponding to the plurality of groups of memory cells.

6. The apparatus of claim 1, wherein the processing device is further configured to monitor the respective RBERs for a plurality of sampling periods.

7. The apparatus of claim 6, wherein the processing device is further configured to determine whether to adjust the read window budget for each sample period of the plurality of sample periods.

8. The apparatus of claim 1, wherein the processing device is further configured to, responsive to determining that the plurality of RBERs is smaller than a threshold, refrain from adjusting the read window budget of the plurality of groups of memory cells.

9. A method, comprising:
determining a plurality of raw bit error rates (RBERs) of a memory sub-system;
providing the plurality of RBERs external to the memory sub-system to generate an identification (ID) of a group of memory cells of a plurality of groups of memory cells;
receiving, at the memory sub-system, the ID of the group of memory cells;
determining, at a controller of the memory sub-system and utilizing the plurality of RBERs and the ID, whether the group of the plurality of groups of memory cells of the memory sub-system is likely to fail; and
responsive to determining that the group of the plurality of groups is likely to fail, refraining from utilizing the group of memory cells.

10. The method of claim 9, further comprising receiving the ID of the group of memory cells from a host that generated the ID of the group of memory cells based on the plurality of RBERs.

11. The method of claim 9, further comprising receiving the ID of the group of memory cells from a network processor via a host.

12. The method of claim 9, further comprises, responsive to determining the plurality of groups is not likely to fail, continuing to utilize the group of memory cells.

13. The method of claim 12, wherein continuing to utilize the group of memory cells further comprises marking the group of memory cells as good such that the group of memory cells is usable.

14. The method of claim 9, wherein refraining from utilizing the group of memory cells further comprises marking the group of memory cells as bad such that the group of memory cells is not usable.

15. The method of claim 9, wherein refraining from utilizing the group of memory cells further comprises marking the group of memory cells as bad such that use of the block of memory cells is limited.

16. An apparatus, comprising:
a memory device;
a processing device coupled to the memory device and configured to:
monitor respective raw bit error rates (RBERs) corresponding to a plurality of groups of memory cells of the memory device;
responsive to determining that an RBER corresponding to a particular group of the plurality of groups of memory cells meets a criteria, adjust a read window budget corresponding to the particular group of the plurality of groups of memory cells;
responsive to determining, utilizing the respective RBERs, that a different group of the plurality of groups of memory cells is likely to fail, refrain from utilizing the different group of the plurality of groups of memory cells.

17. The apparatus of claim 16, wherein the processing device is configured to determine that the RBER meets the criteria by determining whether the RBER is greater than a first RBER threshold.

18. The apparatus of claim 17, wherein the processing device is configured to determine that the different group of memory cells is likely to fail by determining whether the respective RBER is greater than a second RBER threshold where the second RBER is greater than the first RBER.

\* \* \* \* \*